US008389303B2

(12) United States Patent
Takezoe et al.

(10) Patent No.: US 8,389,303 B2
(45) Date of Patent: Mar. 5, 2013

(54) ORGANIC EL ELEMENT AND METHOD OF MANUFACTURING THE SAME

(75) Inventors: Hideo Takezoe, Tokyo (JP); Fumito Araoka, Tokyo (JP); Soon Moon Jeong, Tokyo (JP); Suzushi Nishimura, Yokohama (JP); Goro Suzaki, Yokohama (JP)

(73) Assignees: Tokyo Institute of Technology, Meguro-ku, Tokyo (JP); Nippon Oil Corporation, Minato-ku, Tokyo (JP)

( * ) Notice: Subject to any disclaimer, the term of this patent is extended or adjusted under 35 U.S.C. 154(b) by 0 days.

(21) Appl. No.: 12/670,300

(22) PCT Filed: Jul. 25, 2008

(86) PCT No.: PCT/JP2008/063444
§ 371 (c)(1),
(2), (4) Date: Jul. 26, 2011

(87) PCT Pub. No.: WO2010/010634
PCT Pub. Date: Jan. 28, 2010

(65) Prior Publication Data
US 2012/0018705 A1    Jan. 26, 2012

(51) Int. Cl.
*H01L 21/00* (2006.01)
*H01L 29/08* (2006.01)
(52) U.S. Cl. ........... 438/22; 438/24; 438/42; 257/40; 257/E33.001; 257/E25.008; 257/E51.018
(58) Field of Classification Search .......... 438/22, 438/24, 25, 42; 257/40, E33.001, E25.008, 257/E51.018, E51.001; 313/504, 506; 428/690, 428/917
See application file for complete search history.

(56) References Cited

U.S. PATENT DOCUMENTS

| 2001/0038102 A1* | 11/2001 | Kawase ............... 257/98 |
| 2003/0164679 A1 | 9/2003 | Hamano et al. |
| 2007/0104813 A1* | 5/2007 | Wuister et al. ........ 425/174.4 |

(Continued)

FOREIGN PATENT DOCUMENTS

| JP | 2000-040584 A | 2/2000 |
| JP | 2002-260845 | 9/2002 |

(Continued)

OTHER PUBLICATIONS

Japanese International Search Report Dated Aug. 19, 2008.

(Continued)

*Primary Examiner* — Hsien Ming Lee
(74) *Attorney, Agent, or Firm* — Fitch, Even, Tabin & Flannery, LLP

(57) ABSTRACT

A method of manufacturing an organic EL element having a corrugated structure, the organic EL element comprising a transparent supporting substrate, a transparent electrode, an organic layer, and a metal electrode, the method comprises the steps of: laminating on the transparent supporting substrate a curable-resin layer having concavity and convexity formed thereon in a periodic arrangement in a way that a curable resin is applied onto the transparent supporting substrate, the curable resin is then cured with a master block being pressed thereto, and thereafter the master block is detached; and obtaining an organic EL element by laminating on the curable-resin layer the transparent electrode, the organic layer, and the metal electrode individually so that a shape of the concavity and convexity formed on a surface of the curable-resin layer can be maintained.

7 Claims, 5 Drawing Sheets

U.S. PATENT DOCUMENTS

2007/0287207 A1* 12/2007 Fujii .............................. 438/22
2007/0290607 A1 12/2007 Okada et al.

FOREIGN PATENT DOCUMENTS

| | | |
|---|---|---|
| JP | 2002-313554 A | 10/2002 |
| JP | 2003-257661 | 9/2003 |
| JP | 2004-031221 A | 1/2004 |
| JP | 2004-335470 A | 11/2004 |
| JP | 2005-037419 A | 2/2005 |
| JP | 2005-174914 A | 6/2005 |
| JP | 2006-107743 | 4/2006 |
| JP | 2007-073405 | 3/2007 |
| JP | 2007-109422 | 4/2007 |
| JP | 2008-063554 | 3/2008 |

OTHER PUBLICATIONS

Office Action dated Oct. 20, 2011, corresponding with Japanese Application 2007-171267.

Japanese Office Action dated Feb. 8, 2012 corresponding with Japanese Patent Application JP2007-171267.

* cited by examiner

ORGANIC EL ELEMENT AND METHOD OF MANUFACTURING THE SAME

CROSS-REFERENCE TO RELATED APPLICATIONS

This Application is the U.S. national phase application under 35 U.S.C. §371 of International Application No. PCT/JP2008/063444, filed Jul. 25, 2008, which designated the United States and the entire disclosures of the aforesaid applications are hereby incorporated herein by reference in their entirety for all purposes.

TECHNICAL FIELD

The present invention relates to an organic EL element and a method of manufacturing the same.

BACKGROUND OF THE INVENTION

An organic electroluminescence element (organic EL element) has been used as a self-luminous element to serve as an image display device, such as a display, and to serve as a surface light source. Here, such an organic EL element is generally prepared by sequentially laminating a transparent electrode serving as an anode, an organic layer, and a metal electrode serving as a cathode on a transparent supporting substrate, such as a glass substrate and a transparent plastic film. Therefore, by a voltage applied between the transparent electrode and the metal electrode, an electron supplied from the cathode and a hole supplied from the anode are recombined at the organic layer. Then, when an exciton thus generated transits from an excited state to a ground state, EL emission occurs. Light of the EL emission goes through the transparent electrode, and then is extracted to the outside from the transparent supporting substrate side.

However, in such an organic EL element, there has been a problem that light generated in the organic layer cannot be sufficiently extracted to the outside. To be more specific, most part of the light generated in the organic layer either disappears as heat while repeating multiple reflection within the element or is wave-guided within the element and exits from an end part of the element. Accordingly, there has been a problem that a sufficient efficiency in the extraction to the outside cannot be achieved. Therefore, for example, Japanese Unexamined Patent Application Publication 2002-260845 (Document 1) discloses a technique for solving such a problem. However, even by adopting such a technique, a sufficient efficiency in the extraction to the outside cannot be achieved.

DISCLOSURE OF THE INVENTION

The present invention has been made in consideration of the above-described problem in the conventional technique. An object of the present invention is to provide an organic EL element having sufficient efficiency in extraction to the outside and a method of manufacturing the same.

The present inventors have earnestly studied in order to achieve the above object. As a result, the inventors have revealed that, according to an organic EL element having a corrugated structure, and including: a transparent supporting substrate; a curable-resin layer laminated on the transparent supporting substrate and having on its surface concavity and convexity formed in a periodic arrangement; and a transparent electrode, an organic layer, and a metal electrode which are sequentially laminated on the curable-resin layer, so that the shape of the concavity and convexity formed on the surface of the curable-resin layer can be maintained, a sufficient efficiency in extraction to the outside can be achieved. This discovery has led the inventors to complete the present invention.

A method of manufacturing an organic EL element having a corrugated structure of the present invention is a method of manufacturing an organic EL element comprising a transparent supporting substrate, a transparent electrode, an organic layer, and a metal electrode, and the method includes the steps of: laminating on the transparent supporting substrate a curable-resin layer having concavity and convexity formed thereon in a periodic arrangement in a way that a curable resin is applied onto the transparent supporting substrate, the curable resin is then cured with a master block being pressed thereto, and thereafter the master block is detached; and obtaining an organic EL element by laminating on the curable-resin layer the transparent electrode, the organic layer, and the metal electrode individually so that a shape of the concavity and convexity formed on a surface of the curable-resin layer can be maintained.

In the method of manufacturing an organic EL element of the present invention, a cross-sectional shape of the curable-resin layer preferably is a sinusoidal waveform.

In the method of manufacturing an organic EL element of the present invention, the master block is preferably obtained by a method having the steps of: forming concavity and convexity in a periodic arrangement on a surface of a polymer film in a way that laser light is irradiated on the surface of the polymer film, the polymer film formed on a substrate and made of a polymer which is volume-changeable by irradiation of light and, after a master block material is attached onto the polymer film and cured, obtaining a master block by detaching the master block material after the curing from the polymer film.

Furthermore, in the method of manufacturing an organic EL element of the present invention, the polymer which is volume-changeable by irradiation of light is preferably azobenzene polymer.

Furthermore, in the method of manufacturing an organic EL element of the present invention, the master block material is preferably at least one material selected from the group consisting of a silicone rubber, nickel, silicon, silicon carbide, tantalum, glassy carbon, silica glass, and silica.

Furthermore, in the method of manufacturing an organic EL element of the present invention, the transparent electrode is preferably an electrode made of gold.

Furthermore, in the method of manufacturing an organic EL element of the present invention, a pitch of the concavity and convexity formed on the surface of the curable-resin layer is preferably in a range from 10 nm to 1000 nm, and a height of the concavity and convexity is preferably in a range from 10 nm to 200 nm.

The organic EL element having a corrugated structure of the present invention includes: a transparent supporting substrate; a curable-resin layer being laminated on the transparent supporting substrate and having concavity and convexity formed in a periodic arrangement on a surface thereof; and a transparent electrode, an organic layer, and a metal electrode which are sequentially laminated on the curable-resin layer so that the shape of the concavity and convexity formed on the surface of the curable-resin layer can be maintained.

In the organic EL element of the present invention, a cross-sectional shape of the curable-resin layer is preferably a sinusoidal waveform.

In the organic EL element of the present invention, the transparent electrode is preferably an electrode made of gold.

Furthermore, in the organic EL element of the present invention, a pitch of the concavity and convexity formed on the surface of the curable-resin layer is preferably in a range from 10 nm to 1000 nm, and a height of the concavity and convexity is preferably in a range from 10 nm to 200 nm.

According to the present invention, it is possible to provide an organic EL element having sufficient efficiency in extraction to the outside and a method of manufacturing the same.

DETAILED DESCRIPTION OF THE PREFERRED EMBODIMENTS

Figure 1A:
FIG. 1A is a schematic lateral cross-sectional view illustrating a status in which, in a first step of forming a curable-resin layer having concavity and convexity formed in a periodic arrangement, a curable resin has been applied onto a transparent supporting substrate.
Figure 1A:
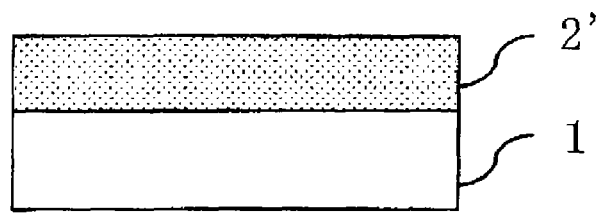

Hereinafter, by referring to drawings, a preferred embodiment of the present invention will be described in detail. Here, in the following descriptions and drawings, same or corresponding elements are indicated by same reference numerals, and redundant descriptions will be omitted.

Firstly, a method of manufacturing an organic EL element having a corrugated structure of the present invention will be described. A method of manufacturing an organic EL element having a corrugated structure of the present invention is a method of manufacturing an organic EL element comprising a transparent supporting substrate, a transparent electrode, an organic layer, and a metal electrode, and the manufacturing method includes the steps of: laminating on the transparent supporting substrate a curable-resin layer having concavity and convexity formed thereon in a periodic arrangement in a way that a curable resin is applied onto the transparent supporting substrate, the curable resin is then cured with a master block being pressed thereto, and thereafter the master block is detached (first step); and obtaining an organic EL element by laminating on the curable-resin layer the transparent electrode, the organic layer, and the metal electrode individually so that a shape of the concavity and convexity formed on a surface of the curable-resin layer can be maintained (second step).

Hereinafter, by referring to FIG. 1A to FIG. 1C, FIG. 2A to FIG. 2D, and FIG. 3A to FIG. 3C, the method of manufacturing an organic EL element of the present invention will be described. These drawings are schematic lateral cross-sectional views for description of a preferred embodiment of the method of manufacturing an organic EL element of the present invention. Here, FIG. 1A to FIG. 1C correspond to the first step, and FIG. 2A to FIG. 2D correspond to the second step. Meanwhile, FIG. 3A to FIG. 3C are views illustrating a preferred embodiment of a method of preparing a master block used in the present invention.

Figure 1B:
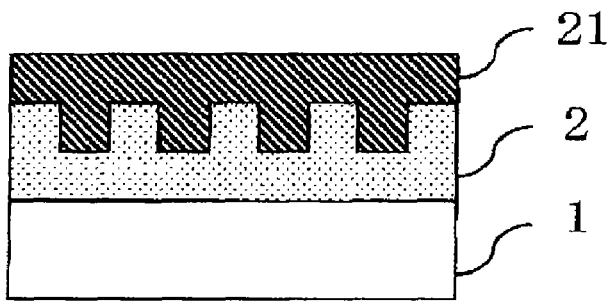
FIG. 1B is a schematic lateral cross-sectional view illustrating a state in which, in the first step, the curable resin is being cured while a master block is being pressed thereto.

In the first step, firstly, as shown in FIG. 1A, a curable resin 2' is applied onto a transparent supporting substrate 1, and then, as shown in FIG. 1B, the curable resin 2' is cured while a master block 21 is pressed thereto. Examples of such a curable resin 2' include an epoxy resin, an acryl resin, a urethane resin, a melamine resin, a urea resin, a polyester resin, a phenol resin, and a cross-linking type liquid crystal resin. An amount of the curable resin 2' to be applied is preferably set so that an average thickness of a curable-resin layer 2 be in a range from 1 μm to 500 μm. Furthermore, as for the condition of curing the curable resin 2', although the condition differs according to a type of a resin to be used, for example, a curing temperature is preferably in a range from room temperature to 250° C. and a curing time is preferably in a range from 0.5 minutes to 3 hours. Alternatively, a method of curing by irradiation of an energy ray, such as an ultraviolet ray and an electron ray, may be adopted, and an amount of the irradiation is preferably in a range from 20 mJ/cm$^2$ to 5 J/cm$^2$. In addition, a nanoimprint method may also be adopted.

Figure 1C:
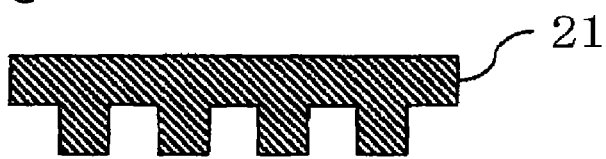
FIG. 1C is a schematic lateral cross-sectional view illustrating a state in which, in the first step, the master block has been detached from the curable-resin layer.
Figure 1C:
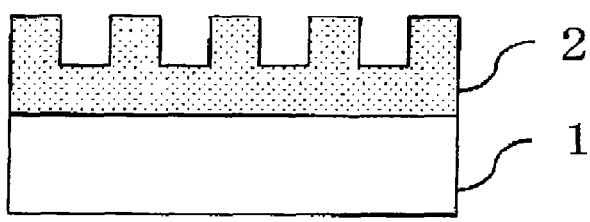

In the first step, next, as shown in FIG. 1C, a master block 21 is detached from the curable-resin layer 2 having been cured. A method of detaching the master block 21 from the cured curable-resin layer 2 as described above is not particularly limited, and a publicly-known method can be adopted accordingly. Then, as described above, it is possible to laminate on the transparent supporting substrate 1 the curable-resin layer 2 having concavity and convexity formed thereon in a periodic arrangement (refer to FIG. 1C).

Furthermore, in such a curable-resin layer 2, a pitch of the concavity and convexity formed on a surface thereof is preferably in a range from 10 nm to 1000 nm, and more preferably in a range from 100 nm to 1000 nm. If the pitch of the concavity and convexity falls below the above-described lower limit, the pitch is too small relative to a visible light wavelength. Accordingly, necessary diffraction tends not to occur. On the other hand, if the pitch exceeds the above-described upper limit, a diffraction angle tends to be smaller. Furthermore, in the curable-resin layer 2, a height of the concavity and convexity formed on the surface is preferably in a range from 10 nm to 1000 nm, and more preferably in a range from 10 nm to 200 nm. If the height of the concavity and convexity falls below the above-described lower limit, the height is too low relative to a visible light wavelength. Accordingly, necessary diffraction tends not to occur. On the other hand, if the height of the concavity and convexity exceeds the above-described upper limit, the electric field distribution within the EL layer becomes uneven. Accordingly, an electric field results in being concentrated in a certain site; therefore, destruction of the element and a shorter lifetime thereof tend to occur.

Figure 2A:
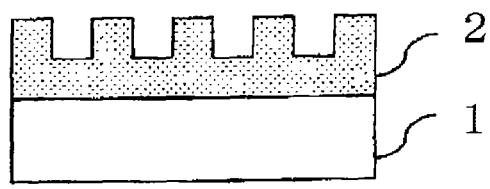
FIG. 2A is a schematic lateral cross-sectional view illustrating a state in which, in a second step of laminating a transparent electrode, an organic layer, and a metal electrode, a curable-resin layer has been formed on a transparent supporting substrate.
Figure 2B:
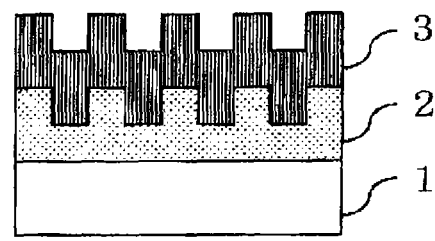
FIG. 2B is a schematic lateral cross-sectional view illustrating a state in which, in the second step, the transparent electrode has been laminated.
Figure 3A:
FIG. 3A is a schematic lateral cross-sectional view illustrating a state in which, in a step of preparing a master block used in the present invention, a polymer film has been formed on a substrate.
Figure 3B:
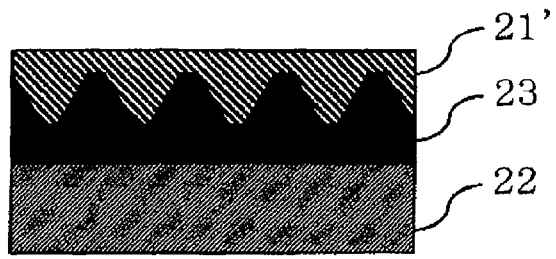
FIG. 3B is a schematic lateral cross-sectional view illustrating a state in which, in the step of preparing a master block used in the present invention, a master block material has been applied onto the polymer film.
Figure 3C:
FIG. 3C is a schematic lateral cross-sectional view illustrating a state in which, in the step of preparing a master block used in the present invention, the master block has been detached from the polymer film.
Figure 3C:
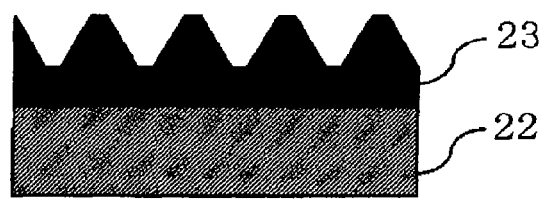

In the second step, firstly, as shown in FIG. 2A to FIG. 2B, a transparent electrode 3 is laminated on the curable-resin layer 2 so that the shape of the concavity and convexity formed on the surface of the curable-resin layer 2 can be maintained. Examples of material used for such a transparent electrode 3 include indium oxide, zinc oxide, tin oxide, indium-tin-oxide (ITO) which is a composite body thereof, gold, platinum, silver, and copper. Among these, from the viewpoint of a balance between transparency and conductivity, ITO and gold are preferable. A thickness of the transparent electrode 3 is preferably in a range from 20 nm to 500 nm. If the thickness falls below the above-described lower limit, the conductivity tends to be insufficient. On the other hand, if the thickness exceeds the above-described upper limit, the transparency of the transparent electrode 3 tends to be insufficient, and an emitted EL light tends not to be sufficiently extracted to the outside. Furthermore, as for a method of laminating the transparent electrode 3 as described above, a publicly-known method, such as a deposition method and a sputtering method, can be adopted accordingly. Among these methods, from the viewpoint of maintaining the shape of the concavity and convexity formed on the surface of the curable-resin layer, a deposition method is preferably employed.

Figure 2C:
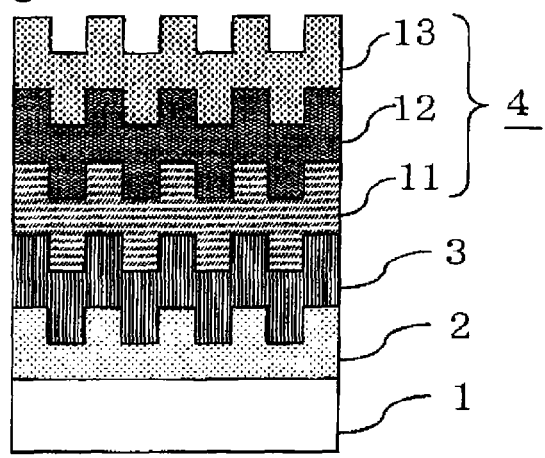
FIG. 2C is a schematic lateral cross-sectional view illustrating a state in which, in the second step, the organic layer has been laminated.

In the second step, next, as shown in FIG. 2C, an organic layer 4 is laminated on the transparent electrode 3 so that the shape of the concavity and convexity formed on the surface of the curable-resin layer 2 can be maintained. Such an organic layer 4 is a laminated body of various organic thin films. An example thereof is a laminated body composed of, as shown in FIG. 2C, an anode buffer layer 11, a hole transport layer 12, and an electron transport layer 13. Here, Examples of material of the anode buffer layer 11 include copper phthalocyanine, PEDOT, and the like. Furthermore, Examples of material of the hole transport layer 12 include derivatives of triphenylamine, triphenyldiamine derivative (TPD), benzidine, pyrazoline, styrylamine, hydrazone, triphenylmethane, carbazole, and the like. Furthermore, Examples of material of the electron transport layer 13 include an aluminum quinolinol complex (Alq), a phenanthroline derivative, an oxadiazole derivative, a triazole derivative, a phenylquinoxaline derivative, and a silole derivative. Furthermore, such an organic layer 4 may be, for example, either a laminated body composed of a hole injection layer formed of a triphenylamine derivative or the like and an emission layer formed of a fluorescent organic solid, such as anthracene, a laminated body composed of the emission layer and an electron injection layer formed of a perylene derivative or the like, or a laminated body of the hole-injection layer, the emission layer, and the electron injection layer. Furthermore, from the viewpoint of making charge injection or hole injection to the organic layer 4 easier, a layer formed of lithium fluoride (LiF), a metal fluoride, such as $Li_2O_3$, alkaline earth metal, such as Ca, Ba, and Cs, having high activity, an organic insulating material, or the like may be provided on the transparent electrode 3 or on the organic layer 4.

In the meantime, in the case where the organic layer 4 is a laminated body composed of the anode buffer layer 11, the hole transport layer 12, and the electron transport layer 13, from the viewpoint of maintaining the shape of the concavity and convexity formed on the surface of the curable-resin layer, the thickness of the anode buffer layer 11, the hole transport layer 12, and the electron transport layer 13 is preferably in a range from 1 nm to 50 nm, in a range from 5 nm to 200 nm, and in a range from 5 nm to 200 nm, respectively. Furthermore, as for a method of laminating the organic layer 4 as described above, a publicly-known method, such as a deposition method and a sputtering method, can be adopted accordingly. Among these methods, from the viewpoint of maintaining the shape of the concavity and convexity formed on the surface of the curable-resin layer, it is preferable to adopt a deposition method.

Figure 2D:
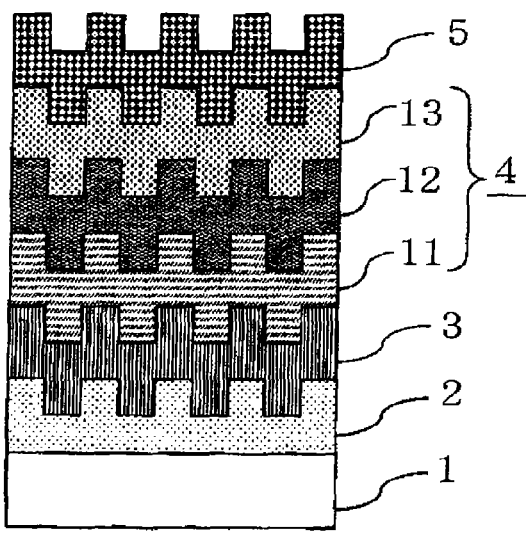
FIG. 2D is a schematic lateral cross-sectional view illustrating a state in which, in the second step, the metal electrode has been laminated.

In the second step, next, as shown in FIG. 2D, a metal electrode 5 is laminated on the organic layer 4 so that the shape of the concavity and convexity formed on the surface of the curable-resin layer 2 can be maintained. As for a material of the metal electrode 5, a material having a small work function can be accordingly used, and the material is not particularly limited. Examples thereof include aluminum, MgAg, MgIn, and AlLi. In the meantime, the thickness of the metal electrode 5 is preferably in a range from 50 nm to 500 nm. If the thickness falls below the above-described lower limit, the conductivity tends to decrease. On the other hand, if it exceeds the above-described upper limit, it tends to be difficult to maintain the shape of concavity and convexity. Furthermore, as for a method of laminating the metal electrode 5 as described above, a publicly-known method, such as a deposition method and a sputtering method, can be adopted accordingly. Among these methods, from the viewpoint of maintaining the shape of the concavity and convexity formed on the surface of the curable-resin layer, it is preferable to adopt a deposition method.

According to the method of manufacturing an organic EL element of the present invention described above, it is possible to manufacture an organic EL element which can achieve a sufficient efficiency in extraction to the outside. To be more specific, in the method of manufacturing an organic EL element of the present invention, as described above, a transparent electrode, an organic layer, and a metal electrode are individually laminated so that the shape of concavity and convexity formed on a surface of a curable-resin layer can be maintained. Therefore, according to such a method, it is possible to obtain an organic EL element having a transparent electrode, an organic layer, and a metal electrode each laminated so as to obtain a corrugated structure. Then, as described above, with a transparent electrode, an organic layer, and a metal electrode each having a corrugated structure, light generated in the organic layer is totally reflected at each interface; therefore, repetition of multiple reflection within the element can be prevented. Furthermore, light having been totally reflected at an interface between the transparent supporting substrate and air can also be emitted again by a diffraction effect of the corrugated structure. Moreover, since the transparent electrode, the organic layer, and the metal electrode each have a corrugated structure, an interelectrode distance between the transparent electrode and the metal electrode is partially shorter. For this reason, compared to one having a uniform interelectrode distance between a transparent electrode and a metal electrode, an increase in electric field strength when a voltage is applied can be expected, and the emission efficiency of the organic EL element can be improved. As described above, according to the method of manufacturing an organic EL element of the present invention, it is possible to manufacture an organic EL element which can achieve a sufficient efficiency in extraction to the outside.

Meanwhile, in the method of manufacturing an organic EL element of the present invention, the cross-sectional shape of the curable-resin layer is preferably a sinusoidal waveform. In the case where the cross-sectional shape of the curable-resin layer is a sinusoidal waveform as described above, compared to the case where the cross-sectional shape is a rectangular, the electric field distribution, when a voltage is applied to the organic EL element, inside the element tends to be uniform. Therefore, by making the cross-sectional shape of the curable-resin layer a sinusoidal waveform as described above, destruction of the organic EL element due to electric field concentration can be prevented, and the lifetime of the organic EL element can be prolonged.

Furthermore, as for the master block 21 used in the method of manufacturing an organic EL element of the present invention, any master block having concavity and convexity formed on a surface thereof can be employed, and a material and a forming method of the master block are not particularly limited. However, from the viewpoint of making the cross-sectional shape of the curable-resin layer a sinusoidal waveform, it is preferable to use one obtained by, for example, the following method. To be more specific, the master block 21 is preferably obtained by a method including the steps of: forming concavity and convexity in a periodic arrangement on a surface of a polymer film in a way that laser light is irradiated on the surface of the polymer film, the polymer film formed on a substrate and made of a polymer which is volume-changeable by irradiation of light (polymer film forming step); and, after a master block material is attached onto the polymer film and cured, obtaining a master block by detaching the master block material after the curing from the polymer film (master block forming step).

In the polymer film forming step, firstly, a polymer film formed of a polymer which is volume-changeable by irradiation of light is formed on a substrate. A substrate 22 is not particularly limited. For example, ones formed of glass, plastic, and metal can be used accordingly. In the meantime, the polymer which is volume-changeable by irradiation of light refers to a polymer whose volume expands or contracts when light having a specific wavelength is irradiated thereto. As such a polymer, a polymer causing a photoisomerization reaction is exemplified. Due to the magnitude of volume change, azobenzene is preferable. In the meantime, as a method for forming a polymer film as described above, for example, a spin coating method, a dip coating method, an instillation method, a gravure printing method, a screen printing method, a relief printing method, a die coating method, a curtain coating method, an inkjet method, a spray coating method, a sputtering method, a vacuum deposition method, and the like can be adopted. Furthermore, the thickness of such a polymer film is preferably in a range from 1 µm to 500 µm, and more preferably in a range from 5 µm to 200 µm.

In the polymer film forming step, next, laser light is irradiated onto a surface of a polymer film 23, and, as shown in FIG. 3A, concavity and convexity are formed on the surface of the polymer film 23 in a periodic arrangement. Here, the laser is not particularly limited, and, for example, an argon laser, a He—Ne laser, a carbon dioxide gas laser, a YAG laser, and a dye laser can be used. Meanwhile, as a method for irradiating the surface of the polymer film 23 with laser light as described above, for example, (i) a method in which laser light is diffracted by a diffraction grating and the light is irradiated; (ii) a method in which laser light is directly irradiated; and (iii) a method in which laser light is irradiated via a mask, can be adopted. Among these methods, from the viewpoint of workability, the method in which laser light is diffracted by a diffraction grating and the light is irradiated is preferable.

Then, by irradiating the surface of the polymer film 23 with laser light by a predetermined method, the volume of the polymer changes. Accordingly, concavity and convexity can be formed on the surface of the polymer film 23 in a periodic arrangement. To be more specific, firstly, laser light (argon laser, wavelength: 488 nm) is diffracted by a diffraction grating, such as a surface relief pattern, and the diffracted light is irradiated onto the polymer film 23. Next, after rotating the diffraction grating (for example, by 120°), the laser light is diffracted and the diffracted light is irradiated onto the polymer film 23. Thereafter, a process in which, after rotating the diffraction grating (for example, by) 120°, the laser light is diffracted and the diffracted light is irradiated onto the polymer film 23 is repeated.

As described above, in accordance with a periodic arrangement, the polymer film 23 is irradiated with laser light. Accordingly, concavity and convexity can be formed on the surface of the polymer film 23 in a periodic arrangement. Here, for example, in the case where the diffraction grating is rotated by 120°, a concavity part or a convexity part having a hexagonal shape is formed.

In the master block forming step, firstly, as shown in FIG. 3B, a master block material 21' is attached onto the polymer film 23 and then cured. Such a master block material 21' is not particularly limited. Examples thereof include inorganic materials, such as nickel, silicon, silicon carbide, tantalum, glassy carbon, silica glass, and silica; and resin compositions, such as a silicone rubber, a urethane rubber, a norbornane resin, polycarbonate, polyethylene terephthalate, polystyrene, polymethylmethacrylate, acryl, and liquid crystal polymer. Among these master block materials, from the viewpoint of formability, fine-shape following capability, and mold releasing, a silicone rubber, nickel, silicon, silicon carbide, tantalum, glassy carbon, silica glass, and silica are preferable, and a silicone rubber, nickel, and silica glass are more preferable. In the meantime, a method for attaching the master block material 21' as described above is not particularly limited. For example, a vacuum deposition method; various coating methods, such as a spin coating method, a spray coating method, a dip coating method, an instillation method, a gravure printing method, a screen printing method, a relief printing method, a die coating method, a curtain coating method, an inkjet method, and a sputtering method, can be adopted. Meanwhile, a condition of curing the master block material 21' varies according to the kind of master block material to be used. However, for example, it is preferable that a curing temperature be in a range from room temperature to 250° C. and a curing time be in a range from 0.5 minutes to 3 hours. Alternatively, a method in which an energy ray, such as an ultraviolet ray and an electron ray, is used for irradiation for curing may also be adopted. The amount of irradiation is preferably in a range from 20 mJ/cm$^2$ to 10 J/cm$^2$. In addition, a nanoimprint method may also be adopted.

In the master block forming step, thereafter, as shown in FIG. 3C, a master block material 21 after curing is detached from the polymer film 23, and a master block 21 is obtained. A method for detaching the master block material 21 after curing from the polymer film 23 is not particularly limited, and a publicly-known method can be adopted accordingly.

Next, the organic EL element having a corrugated structure of the present invention will be described. The organic EL element having a corrugated structure of the present invention includes: a transparent supporting substrate; a curable-resin layer being laminated on the transparent substrate and having on its surface concavity and convexity formed in a periodic arrangement; and a transparent electrode, an organic layer, and a metal electrode which are sequentially laminated on the curable-resin layer so that the shape of the concavity and convexity formed on the surface of the curable-resin layer can be maintained. Then, such an organic EL element can be obtained by the above-described method of manufacturing an organic EL element of the present invention.

Meanwhile, in the organic EL element of the present invention, the cross-sectional shape of the curable-resin layer is preferably a sinusoidal waveform. In the case where the cross-sectional shape of the curable-resin layer is a sinusoidal waveform as described above, compared to the case where the cross-sectional shape is a rectangular, the electric field distribution, when a voltage is applied to the organic EL element, inside the element tends to be uniform. Therefore, by making the cross-sectional shape of the curable-resin layer a sinusoidal waveform as described above, destruction of the organic EL element due to electric field concentration can be prevented, and the lifetime of the organic EL element can be prolonged.

Furthermore, in the organic EL element of the present invention, a pitch of the concavity and convexity formed on the surface of the curable-resin layer is preferably in a range from 10 nm to 1000 nm, and more preferably in a range from 100 nm to 1000 nm. If the pitch of the concavity and convexity falls below the above-described lower limit, the pitch is too small relative to a visible light wavelength. Accordingly, necessary diffraction tends not to occur. On the other hand, if the pitch of the concavity and convexity exceeds the above-described upper limit, a diffraction angle tends to be smaller. Furthermore, in the organic EL element of the present invention, a height of the concavity and convexity formed on the surface of the curable-resin layer is preferably in a range from 10 nm to 1000 nm, and more preferably in a range from 10 nm to 200 nm. If the height of the concavity and convexity falls below the above-described lower limit, the height is too low relative to a visible light wavelength. Accordingly, necessary diffraction tends not to occur. On the other hand, if the height of the concavity and convexity exceeds the above-described upper limit, the electric field distribution within the EL layer becomes uneven. Accordingly, an electric field is concentrated in a certain site; therefore, destruction of the element and a shorter lifetime thereof tend to occur.

As for materials for the transparent supporting substrate, the curable-resin layer, the transparent electrode, the organic layer, and the metal electrode which are related to the organic EL element of the present invention, similar materials to those used in the above-described method of manufacturing the organic EL element of the present invention can be used.

EXAMPLES

Hereinafter, the present invention will be more concretely described on the basis of Example and Comparative Example. However, the present invention is not limited to the following Example.

Example 1

Figure 4:
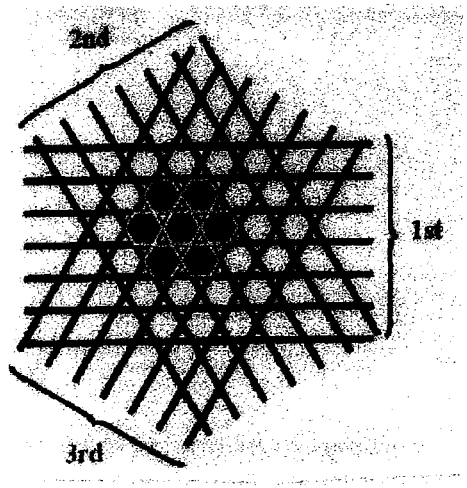
FIG. 4 is a schematic view illustrating a preferred embodiment of a method of irradiating an azobenzene polymer film with diffracted light of laser light.
Figure 5:
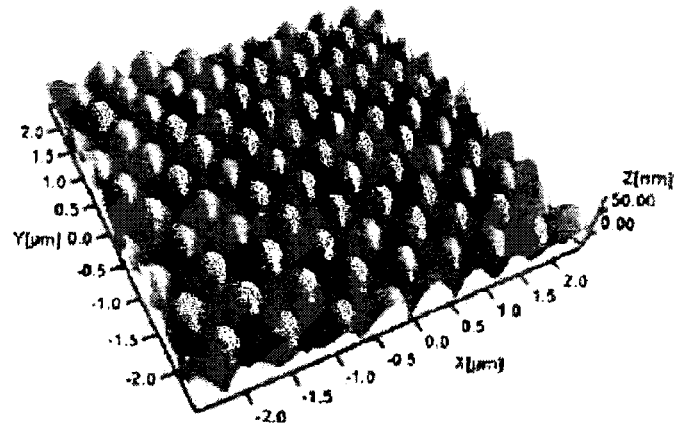
FIG. 5 is a photograph showing an image in which a result of surface shape measurement using an atomic force microscope of the azobenzene polymer film having been irradiated with diffracted light of laser light is displayed on a display.

Firstly, azobenzene polymer was applied on a substrate 22 by a spin coating method so as to achieve the film thickness of 0.8 µm, and an azobenzene polymer film 23 was formed. Thereafter, argon laser light was diffracted by a surface relief-type diffraction grating, and the diffracted light was irradiated onto a surface of the azobenzene polymer film 23. Next, after the diffraction grating was rotated by 120°, laser light was diffracted, and the diffracted light was irradiated onto the azobenzene polymer film 23. Then, the diffraction grating was further rotated by 120°, laser light was diffracted, and the diffracted light was irradiated onto the azobenzene polymer film 23 (refer to FIG. 4). As described above, concavity and convexity were formed on the surface of the azobenzene polymer film 23 in a periodic arrangement (refer to FIG. 3A). Here, surface shape measurement of the obtained azobenzene polymer film 23 was carried out using an atomic force microscope. The obtained result is shown in FIG. 5.

Next, a silicone rubber (made by Wacker Chemie GmbH, product name "Elastosil RT601") was applied as the master block material 21' onto the azobenzene polymer film 23 by an instillation method, heated at 50° C. for 1 hour for curing, and then detached from the azobenzene polymer film 23 to obtain the master block 21 (refer to FIG. 3B and FIG. 3C).

Figure 6:
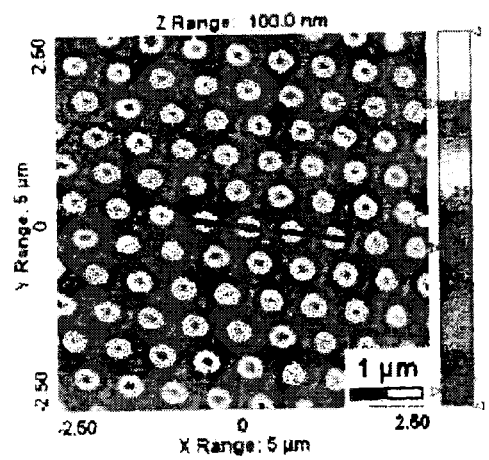
FIG. 6 is a photograph showing an image in which a result of surface observation using an atomic force microscope of a curable-resin layer in Example 1 is displayed on a display.
Figure 7:
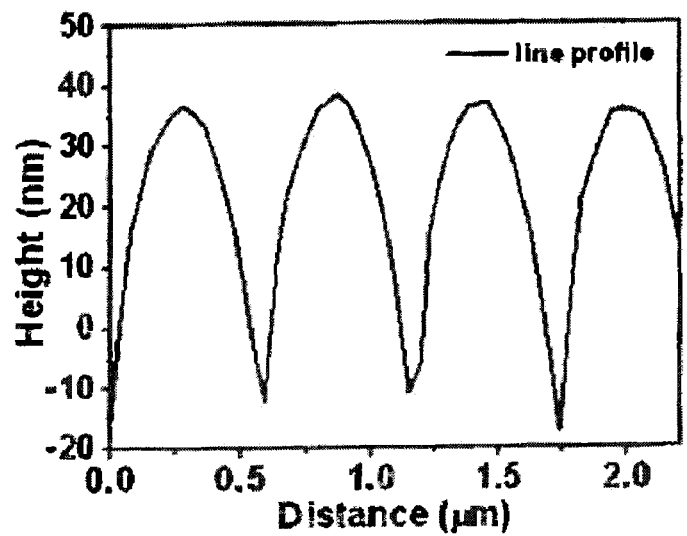
FIG. 7 is a graph showing a measurement result of height distribution of the curable-resin layer at a position of a line (indicated by 1 in FIG. 6) shown in the image of the surface observation result shown in FIG. 6.

Then, a glass substrate 1 (made by Matsunami Ltd., product name "Micro slide glass") and a curable resin 2' (made by Norland Optical Adhesive Inc., product name "NOA 61") were prepared, and the curable resin 2' was applied onto the glass substrate 1. Thereafter, the curable resin 2' was irradiated, while the master block 21 is pressed thereto, with an ultraviolet ray for 1 hour, and cured (refer to FIG. 1A and FIG. 1B). Thereafter, the master block 21 was detached from the curable-resin layer 2 after curing, and the curable-resin layer 2 having concavity and convexity formed on the glass substrate 1 in a periodic arrangement was formed (refer to FIG. 1C). Here, the pitch of the concavity and convexity formed on the surface of the curable-resin layer 2 was 500 nm, and the height of the concavity and convexity was 50 nm. Furthermore, surface observation of the obtained curable-resin layer 2 was carried out using an atomic force microscope (AFM). The obtained result is shown in FIG. 6 and FIG. 7.

Subsequently, on the curable-resin layer 2, a transparent electrode 3 (gold, thickness: 30 nm), an anode buffer layer 11 (copper phthalocyanine, thickness: 10 nm), a hole transport layer 12 [N,N'-diphenyl-N,N'-bis(3-methylphenyl)-1,1'-diphenyl-4,4'-diamine, thickness: 40 nm], an electron transport layer 13 (8-hydroxyquinoline aluminum, thickness: 60 nm), a lithium fluoride layer (thickness: 1 nm), and a metal electrode 5 (aluminum, thickness: 150 nm) are laminated each by a deposition method so that the shape of the concavity and convexity formed on the surface of the curable-resin layer 2 can be maintained, and thus an organic EL element was prepared (refer to FIG. 2A and FIG. 2D).

Comparative Example 1

Except that the master block prepared in Example 1 was not used and that concavity and convexity were not formed in the curable-resin layer, an organic EL element was prepared in the same manner as in Example 1.

<Evaluation Result>

Figure 8:
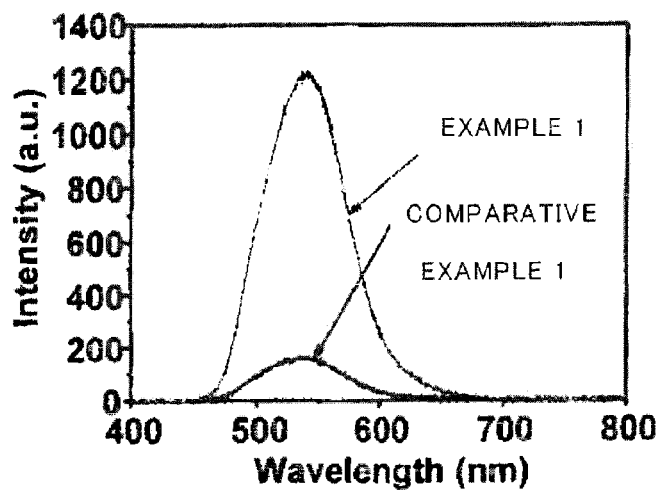
FIG. 8 is a graph showing an emission spectrum of an organic EL element obtained in Example 1 and Comparative Example 1.

An emission spectrum of the organic EL element obtained in Example 1 and Comparative Example 1 was measured. Here, an emission spectrum was measured in the following manner. To be more specific, while a voltage of 10 V was applied to the organic EL element obtained in Example 1 and Comparative Example 1, a spectrometer (made by Ocean Optics, Inc., product name "USB-2000") was placed at a distance of 7 cm from the element, and emission spectrum analysis was carried out. The obtained result is shown in FIG. 8. As apparent from the result shown in FIG. 8, in the case of using the organic EL element of the present invention (Example 1), it was confirmed that a sufficient efficiency in extraction to the outside could be achieved.

Test Example 1

Figure 9A:
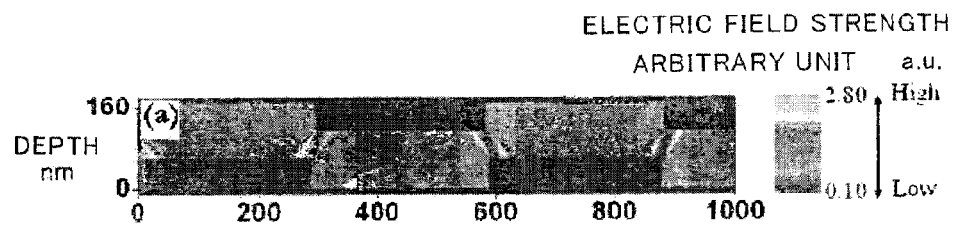
FIG. 9A is a photograph showing an image in which an analysis result (corresponding to the case where the cross-sectional shape of the curable-resin layer is a rectangle) of the internal electric field distribution of an organic EL element in Test Example 1 is displayed on a display.
Figure 9B:
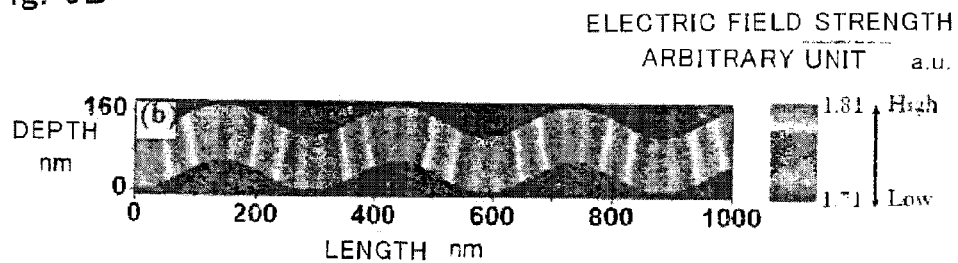
FIG. 9B is a photograph showing an image in which an analysis result (corresponding to the case where the cross-sectional shape of the curable-resin layer is a sinusoidal waveform) of the internal electric field distribution of an organic EL element in Test Example 1 is displayed on a display.

Regarding the case where the cross-sectional shape of the curable-resin layer 2 is a sinusoidal waveform and the case where the cross-sectional shape of the curable-resin layer 2 is a rectangular, an electric field distribution inside the organic EL element was simulated. To be more specific, in the case where the pitch of the concavity and convexity formed on the curable-resin layer is set to 300 nm, the height of the concavity and convexity is set to 50 nm, and the transparent electrode 3, the organic layer 4 having a thickness of 110 nm, and the metal electrode 5 are laminated on the curable-resin layer 2 so that the shape of the concavity and convexity formed on the surface of the curable-resin layer 2 can be maintained, an electric distribution inside the each organic EL element was simulated. The obtained results are shown in FIG. 9A and FIG. 9B (FIG. 9A corresponds to the case where the cross-sectional shape of the curable-resin layer is a rectangular, and FIG. 9B corresponds to the case where the cross-sectional shape of the curable-resin layer is a sinusoidal waveform). As apparent from the results shown in FIG. 9A and FIG. 9B, it was confirmed that, in the case where the cross-sectional shape of the curable-resin layer is a sinusoidal waveform, compared to the case where the cross-sectional shape of the curable-resin layer is a rectangular, an electric field distribution, when a voltage is applied to the organic EL element, inside the element tends to be uniform. Therefore, it was confirmed that, with the cross-sectional shape of the curable-resin layer being a sinusoidal waveform, destruction of the organic EL element due to electric field concentration can be prevented, and the lifetime of the organic EL element can be prolonged.

Industrial Applicability

As described above, according to the present invention, it is possible to provide an organic EL element having a sufficient efficiency in extraction to the outside and a method of manufacturing the same.

The invention claimed is:

1. A method of manufacturing an organic EL element having a corrugated structure, the organic EL element comprising a transparent supporting substrate, a transparent electrode, an organic layer, and a metal electrode, the method comprising the steps of:

laminating on the transparent supporting substrate a curable-resin layer having concavity and convexity formed thereon in a periodic arrangement in a way that a curable resin is applied onto the transparent supporting substrate, the curable resin is then cured with a master block being pressed thereto, and thereafter the master block is detached; and obtaining the organic EL element by laminating on the curable-resin layer, the transparent electrode, the organic layer, and the metal electrode individually so that a shape of the concavity and convexity formed on a surface of the curable-resin layer can be maintained; wherein a cross sectional shape of the curable-resin layer is a sinusoidal waveform, the pitch of concavity and convexity formed on the surface of the curable-resin layer is in a range from 10 nm to 1000 nm, and a height of the concavity and convexity is in a range from 10 nm to 200 nm, the organic layer is a laminated body composed of an anode buffer layer, a hole transport layer, and an electron transport layer, and a thickness of the transparent electrode is in a range from 20 nm to 500 nm, a thickness of the anode buffer layer is in a range from 1 nm to 50 nm, a thickness of the hole transport layer is in a range from 5 nm to 200 nm, a thickness of the electron transport layer is in a range from 5 nm to 200 nm, and a thickness of the metal electrode is in a range from 50 nm to 500 nm.

2. The method of manufacturing an organic EL element according to claim 1, wherein the master block is obtained by a method including the steps of:

forming concavity and convexity in a periodic arrangement on a surface of a polymer film in a way that laser light is irradiated on the surface of the polymer film, the polymer film formed on a substrate and made of a polymer which is volume-changeable by irradiation of light, and after a master block material is attached onto the polymer film and cured, obtaining the master block by detaching the master block material after the curing from the polymer film.

3. The method of manufacturing an organic EL element according to claim 2, wherein the polymer which is volume-changeable by irradiation of light is azobenzene polymer.

4. The method of manufacturing an organic EL element according to claim 2, wherein the master block material is at least one material selected from the group consisting of a silicone rubber, nickel, silicon, silicon carbide, tantalum, glassy carbon, silica glass, and silica.

5. The method of manufacturing an organic EL element according to claim 1, wherein the transparent electrode is an electrode made of gold.

6. An organic EL element having a corrugated structure, comprising:

a transparent supporting substrate;

a curable-resin layer being laminated onto the transparent supporting substrate and having concavity and convexity in a periodic arrangement on a surface; and a transparent electrode, an organic layer, and a metal electrode which are sequentially laminated onto the curable-resin layer so that a shape of the concavity and convexity formed on the surface of the curable-resin layer can be maintained; wherein a cross sectional shape of the curable-resin layer is a sinusoidal wave form, a pitch of the concavity and convexity formed on the surface of the curable-resin layer is in a range from 10 nm to 1000 nm, and a height of the concavity and convexity is in a range from 10 nm to 200 nm, the organic layer is a laminated body composed of an anode buffer layer, a hole transport layer, and an electron transport layer, and a thickness of the transparent electrode is in a range from 20 nm to 500 nm, a thickness of the anode buffer layer is in a range from 1 nm to 50 nm, a thickness of the hole transport layer is in a range from 5 nm to 200 nm, a thickness of the electron transport layer is in a range from 5 nm to 200 nm, and a thickness of the metal electrode is in a range from 50 nm to 500 nm.

7. The organic EL element according to claim 6, wherein the transparent electrode is an electrode made of gold.

* * * * *